United States Patent
Maeda

(10) Patent No.: US 9,213,288 B2
(45) Date of Patent: Dec. 15, 2015

(54) OPERATION PANEL SUPPORT MECHANISM AND IMAGE FORMING APPARATUS HAVING THE SAME

(71) Applicant: KYOCERA Document Solutions Inc., Osaka (JP)

(72) Inventor: Hiroyuki Maeda, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 14/661,637

(22) Filed: Mar. 18, 2015

(65) Prior Publication Data

US 2015/0282347 A1    Oct. 1, 2015

(30) Foreign Application Priority Data

Mar. 31, 2014 (JP) .................. 2014-071588

(51) Int. Cl.
*G03G 15/00* (2006.01)
*H05K 5/00* (2006.01)
*H05K 5/02* (2006.01)

(52) U.S. Cl.
CPC .......... *G03G 15/5016* (2013.01); *H05K 5/0017* (2013.01); *H05K 5/0204* (2013.01); *H05K 5/0217* (2013.01); *H05K 5/0226* (2013.01)

(58) Field of Classification Search
CPC . G03G 15/50; G03G 15/5016; H05K 5/0017; H05K 5/0204; H05K 5/0217; H05K 5/0226

USPC ............................................... 399/75, 81, 126
See application file for complete search history.

(56) References Cited

U.S. PATENT DOCUMENTS

| 3,694,923 A * | 10/1972 | Heiberger .................. 33/501.19 |
| 6,314,254 B1 * | 11/2001 | Wakahara ....................... 399/81 |
| 2005/0205725 A1 * | 9/2005 | Yokouchi et al. .......... 248/125.1 |
| 2006/0230689 A1 * | 10/2006 | Asakawa ......................... 52/32 |

FOREIGN PATENT DOCUMENTS

JP    2011-215288 A    10/2011
JP    2013-38690 A    2/2013

* cited by examiner

*Primary Examiner* — Benjamin Schmitt
(74) *Attorney, Agent, or Firm* — Stein IP, LLC

(57) ABSTRACT

An operation panel support mechanism according to the present disclosure includes a first support member, a second support member, a swing mechanism, and a movement mechanism. The first support member is fixed to an apparatus main body. The second support member is fixed to an operation panel. The swing mechanism supports the second support member swingably up and down, and holds the second support member at an arbitrary angle. The movement mechanism supports the second support member movably up and down in a translation manner with respect to the first support member, and holds the second support member at an arbitrary height.

5 Claims, 5 Drawing Sheets

OPERATION PANEL SUPPORT MECHANISM AND IMAGE FORMING APPARATUS HAVING THE SAME

INCORPORATION BY REFERENCE

The present application is based on Japanese Patent Application No. 2014-071588 filed on Mar. 31, 2014, the contents of which are hereby incorporated by reference.

BACKGROUND

The present disclosure relates to an operation panel support mechanism and an image forming apparatus having the same, more particularly, to an operation panel support mechanism for mounting an operation panel onto an apparatus main body and to an image forming apparatus having the operation panel support mechanism.

Conventionally, an image forming apparatus is provided with an operation panel that has an operation button and a display portion which are operated by a user. The operation panel is usually fixed to a main body of the image forming apparatus. However, in the fixed type of operation panel, angle adjustment is impossible; accordingly, for example, in a case where the user is a tall or short person, or in a case where the user uses a wheelchair, visibility and operability for the user decline.

Accordingly, an image forming apparatus is proposed, in which an operation panel is swingable up and down. As such image forming apparatuses, for example, an image forming apparatus is known, in which it is possible to fix an angle of the operation panel at several steps by unlocking a lever member, and another image forming apparatus is known, which has a so-called free stop function to hold the operation panel at an arbitrary angle. The image forming apparatus having a so-called free stop function is able to improve the visibility and operability for the user compared with the image forming apparatus that can fix the angle of the operation panel at only several steps.

SUMMARY

An operation panel support mechanism according to an aspect of the present disclosure is an operation panel support mechanism that mounts the operation panel onto the apparatus main body. The operation panel support mechanism includes a first support member, a second support member, a swing mechanism, and a movement mechanism. The first support member is fixed to the apparatus main body. The second support member is fixed to the operation panel. The swing mechanism supports the second support member swingably up and down, and holds the second support member at an arbitrary angle in a swingable range. The movement mechanism supports the second support member movably up and down in a translation manner with respect to the first support member, and holds the second support member at an arbitrary height in a translation range.

Still other objects of the present disclosure and specific advantages obtained by the present disclosure will become more apparent from the following detailed description of a preferred embodiment.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Hereinafter, an embodiment of the present disclosure is described with reference to the drawings.

Figure 1:
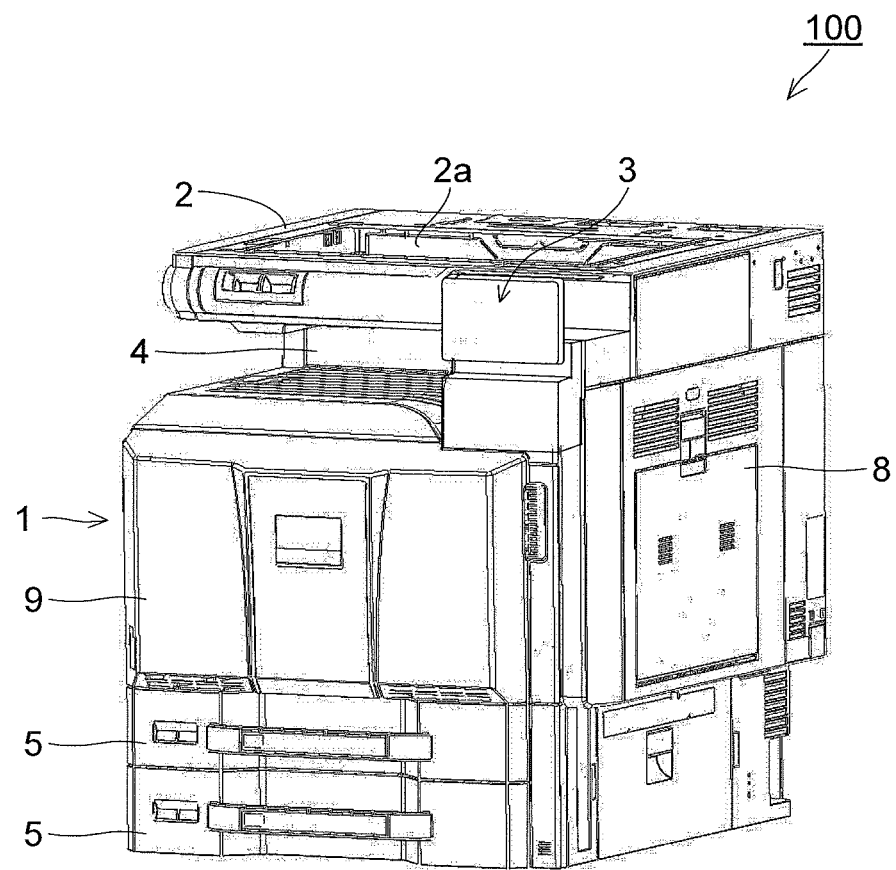
FIG. 1 is a perspective view showing a structure of an image forming apparatus according to an embodiment of the present disclosure.

With reference to FIG. 1 to FIG. 9, an image forming apparatus 100 according to an embodiment of the present disclosure is described. As shown in FIG. 1, the image forming apparatus 100 includes an apparatus main body 1, and an operation panel 3 that is mounted on a front side of the apparatus main body 1.

An image reading device 2 in an upper portion of the apparatus main body 1 is provided therein with an image reading portion that reads image information of a document on a contact glass 2a. The image reading portion is composed of a scan optical system that incorporates: a scanner lamp for shining light onto a document during a copy period; and a mirror for changing an optical path of reflected light from the document, a light collecting lens that collects the reflected light from the document to form an image, a CCD sensor for converting image light of the formed image into an electric signal and the like (any one of them is not shown), reads and converts a document image into image data.

The operation panel 3 has an operation button and a display portion that are operated by a user, and is disposed on a front portion of the image reading device 2. In the meantime, an upper portion of the image reading device 2 is provided with a platen (not shown) that pushes a document placed on the contact glass 2a and is disposed in an openable and closable manner. The platen may be provided thereon with an automatic document conveyance device (not shown) that automatically conveys documents of a document bundle in succession one after another onto the contact glass 2a.

Under the image reading device 2, there is provided an in-housing sheet delivery space 4 that is largely opened toward a left surface and a front surface.

A front portion of the apparatus main body 1 is provided with a plurality of sheet feeding cassettes 5 (here, two) for storing sheets (recording medium) in a removable manner with respect to the apparatus main body 1.

An inside of the apparatus main body 1 is provided with an image forming portion, a fixing portion, a sheet conveyance portion and the like that are not shown. Based on image data read by the image reading device 2, the image forming portion transfers a toner image onto a supplied sheet to form an image. The image forming portion includes: a photosensitive drum that carries an electrostatic latent image; an electrifying unit that electrifies a surface of the photosensitive drum; a light exposure unit that forms an electrostatic latent image corresponding to a document image onto the surface of the photosensitive drum by means of a laser beam and the like; a developing unit that attaches a developer to the formed electrostatic latent image to form a toner image; a transfer roller that transfers the toner image to a sheet; a cleaning blade that removes toner remaining on the photosensitive drum surface and the like. Besides, the fixing portion heats and presses the sheet to which the toner image is transferred, thereby fixing the toner image onto the sheet. The sheet conveyance portion (not shown) extends upward along a right surface of the apparatus main body 1, and conveys a sheet from to the sheet feeding cassette 5 to the image forming portion.

Besides, a right lower portion of the inside of the apparatus main boy 1 is provided with a sheet feeding portion (not shown) that sends a sheet from the sheet feeding cassette 5 and conveys the sheet to the sheet conveyance portion (not shown) disposed above. Besides, a right surface of the apparatus main body 1 is provided with a right cover member 8 that covers a right side of the sheet conveyance portion, and a front surface of the apparatus main body 1 is provided with a front cover member 9 in an openable and closable manner.

Next, a structure for mounting the operation panel 3 onto the apparatus main body 1 is described.

Figure 2:
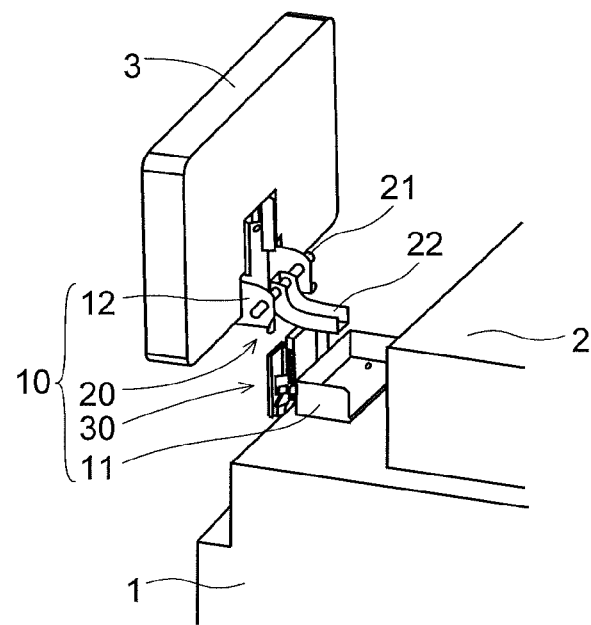
FIG. 2 is a perspective view showing, from a rear side, a structure around an operation panel support mechanism of an image forming apparatus according to an embodiment of the present disclosure.

As shown in FIG. 2, the operation panel 3 is mounted on the apparatus main body 1 by using an operation panel support mechanism 10. The operation panel support mechanism 10 is composed of: a first support member 11 fixed to the apparatus main body 1; a second support member 12 fixed to the operation panel 3; a swing mechanism 20 that supports the second support member 12 swingably up and down; and a movement mechanism 30 that supports the second support member 12 movably up and down (in the vertical direction) in a translation manner with respect to the first support member 11.

Figure 3:
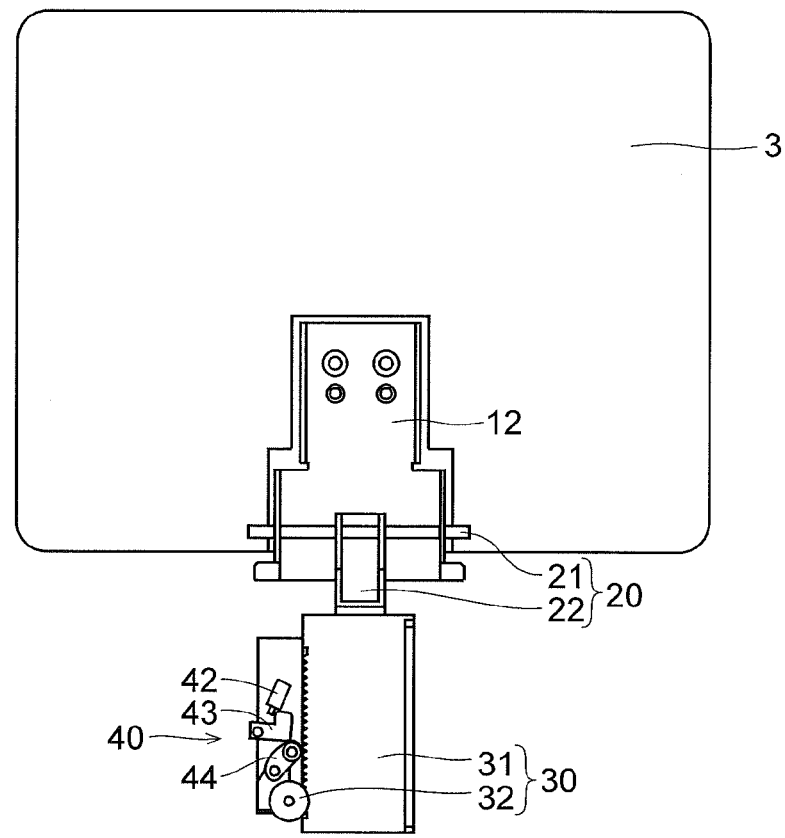
FIG. 3 is a rear view showing a structure around an operation panel support mechanism of an image forming apparatus according to an embodiment of the present disclosure.

The first support member 11 is formed by folding a sheet metal and fixed to the apparatus main body 1 by using a screw and the like. As shown in FIG. 2 and FIG. 3, the second support member 12 is formed by folding a sheet metal and fixed to the operation panel 3 by using a screw and the like.

The swing mechanism 20 includes: a shaft portion 21 that is inserted into an insertion hole of a folded portion of the second support member 12 and extends in a horizontal direction; and a shaft portion support member 22 that is formed by folding a sheet metal and penetrated by the shaft portion 21. The second support member 12 swings up and down about the shaft portion 21, whereby the operation panel 3 swings up and down. The operation panel 3 is swingable in a range from a position (position in FIG. 4) of being upright vertically to a position (position in FIG. 5) of being inclined inward the apparatus by 75 degrees.

Figure 4:
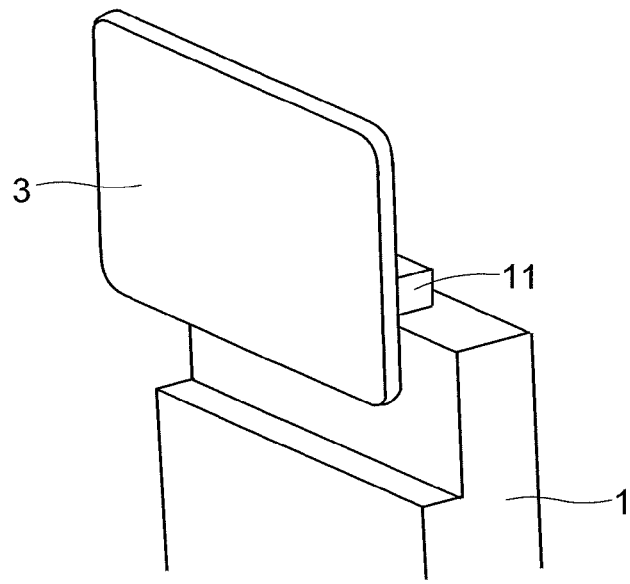
FIG. 4 is a perspective view showing a state in which an operation panel of an image forming apparatus according to an embodiment of the present disclosure is elevated upright.
Figure 5:
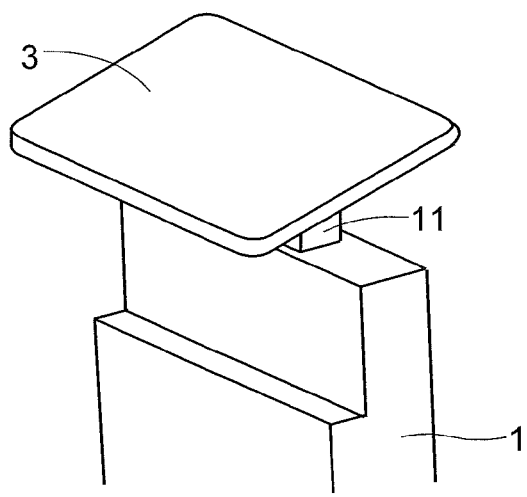
FIG. 5 is a perspective view showing a state in which an operation panel of an image forming apparatus according to an embodiment of the present disclosure is inclined inward the apparatus.

The operation panel 3 is disposed not to protrude forward from the front surface (left front surface of FIG. 1) of the apparatus main body 1, and for example, disposed to be coplanar with the front surface of the apparatus main body 1 with elevated upright (state in FIG. 4).

Besides, the swing mechanism 20 is composed to have a so-called free stop function that holds the second support member 12 at an arbitrary angle in a swingable range. For example, by forming the folded portion of the second support member 12 and the folded portion of the shaft portion support member 22 to be close to each other and interposing a wave washer into a gap between them, it is possible to easily hold the second support member 12 at an arbitrary angle by means of frictional force due to the wave washer.

Besides, in a case where a load exerted onto an operation surface (touch surface) of the operation panel 3 in a direction perpendicular to the operation surface of the operation panel 3 is equal to a first value or smaller (load when the user touches the operation surface of the operation panel 3 and is 100 N to 150 N, for example), the swing mechanism 20 holds the second support member 12 at a predetermined angle. Besides, in a case where the load exerted onto the operation surface (touch surface) of the operation panel 3 in the direction perpendicular to the operation surface of the operation panel 3 is larger than the first value, the swing mechanism 20 swings the second support member 12. In this way, the angle of the operation panel 3 is not changed by a usual input operation (touch) by the user, but it is possible to change the angle of the operation panel 3 only when the angle of the operation panel 3 is desired to be changed (when a load larger than the first value is exerted onto the operation panel 3). In the meantime, the set load having the first value is easily adjustable by changing, for example, a thickness or size of the wave washer and the like.

Figure 6:
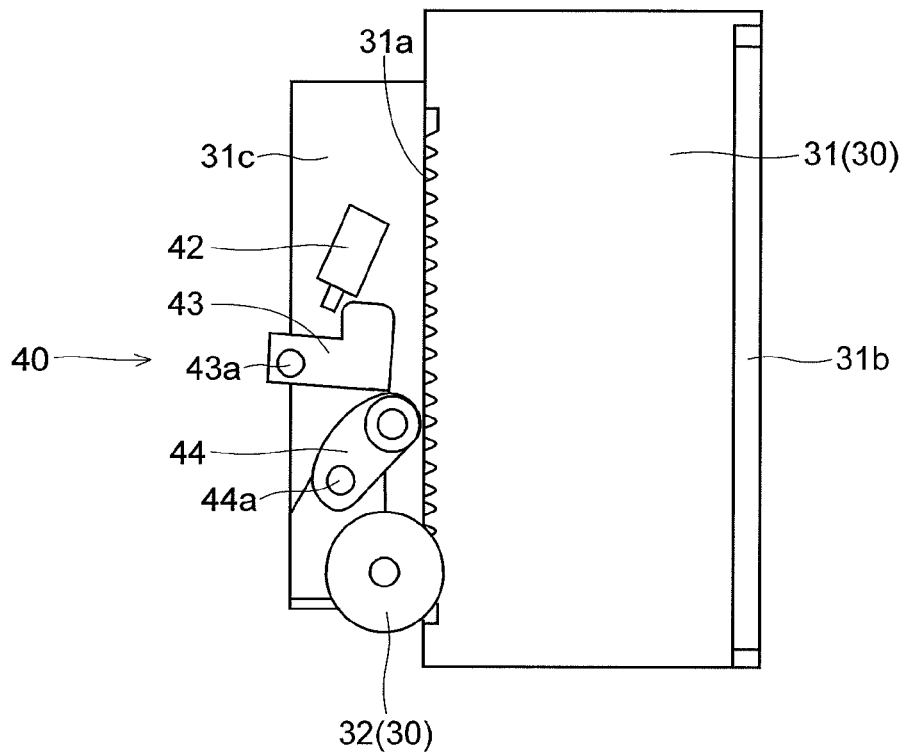
FIG. 6 is a view showing, from a rear side, a structure around a movement mechanism and detection mechanism of an image forming apparatus according to an embodiment of the present disclosure.
Figure 7:
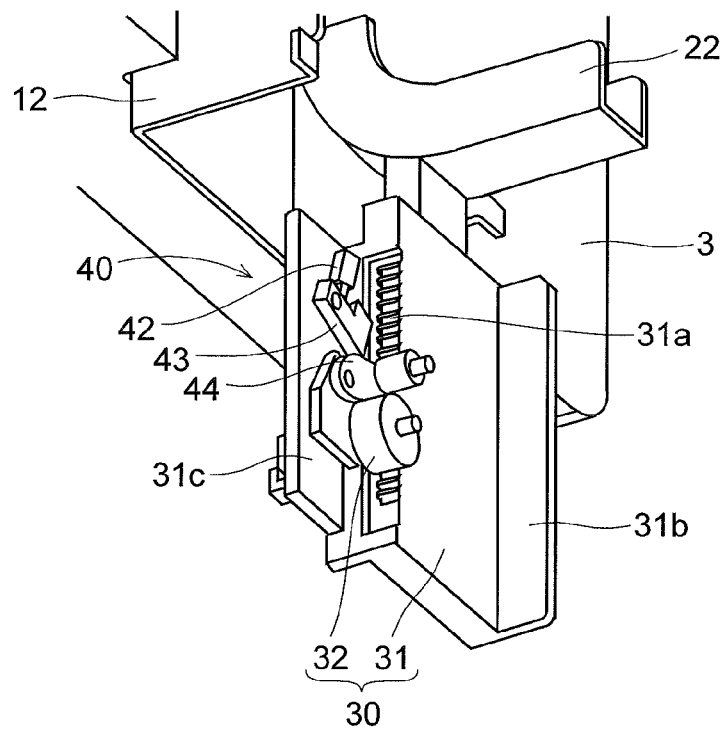
FIG. 7 is a perspective view showing, from a rear side, a structure around a movement mechanism and detection mechanism of an image forming apparatus according to an embodiment of the present disclosure.

As shown in FIG. 3, the movement mechanism 30 includes: a rack member 31 that moves a predetermined distance (e.g., 0 mm or longer to 40 mm or shorter) up and down together with the second support member 12; and a drive gear 32 that is supported by the first support member 11 and engages with the rack member 31. The rack member 31 is fixed to a lower surface of the shaft portion support member 22. Besides, as shown in FIG. 6 and FIG. 7, the rack member 31 has: a rack gear portion 31a; a one end piece 31b which is disposed to protrude from one side (right side of FIG. 6) of the rack gear portion 31a in a direction (direction perpendicular to the paper surface of FIG. 6) perpendicular to the rack member 31 and is formed to extend up and down with a constant thickness; and the other end piece 31c which is disposed to protrude from the other side (left side of FIG. 6) of the rack gear portion 31a in an extending direction (leftward direction of FIG. 6) of the rack member 31 and is formed to extend up and down with a constant thickness.

The drive gear 32 engages with the rack gear portion 31a, and rotates as the rack member 31 moves up and down. The first support member 11 (see FIG. 2) is provided with a guide rail member (not shown) that extends up and down along the one end piece 31b and the other end piece 31c, and the one end piece 31b and the other end piece 31c move up and down along the guide rail member. In the meantime, the drive gear 32 and a descent stop mechanism 40 described later are mounted on the first support member 11 via the guide rail member and the like.

Besides, the movement mechanism 30 is composed to have a so-called free stop function that holds the second support member 12 at an arbitrary height in a translation range. For example, if the rotation of the drive gear 32 is limited by using a wave washer and the like, it is possible to easily hold the second support member 12 at an arbitrary height.

Besides, in a case where the load exerted, up and down (in the vertical direction), onto the operation panel 3 is equal to a second value or smaller (load when the user touches the operation surface of the operation panel 3 and is 100 N to 150 N, for example), the movement mechanism 30 holds the second support member 12 at a predetermined height. Besides, in a case where the load exerted, up and down, onto the operation panel 3 is larger than the second value, the movement mechanism 30 moves the second support member 12 up and down. In this way, the height of the operation panel 3 is not changed by the usual input operation (touch) by the user, but it is possible to change the height of the operation panel 3 only when the height of the operation panel 3 is desired to be changed (when a load larger than the second value is exerted onto the operation panel 3). In the meantime, the set load having the second value is easily adjustable by changing, for example, a thickness or size of the wave washer and the like.

Near the movement mechanism 30, there is provided the descent stop mechanism 40 that stops the descent of the second support member 12 when the second support member 12 descends at a speed or higher than a predetermined speed with respect to the first support member 11. Specifically, the descent stop mechanism 40 includes: a detection mechanism 41 (see FIG. 8) that detects a descent speed of the rack member 31; a solenoid 42 that is driven based on a detection result from the detection mechanism 41; a stopper 43; and an actuator portion 44.

Figure 8:
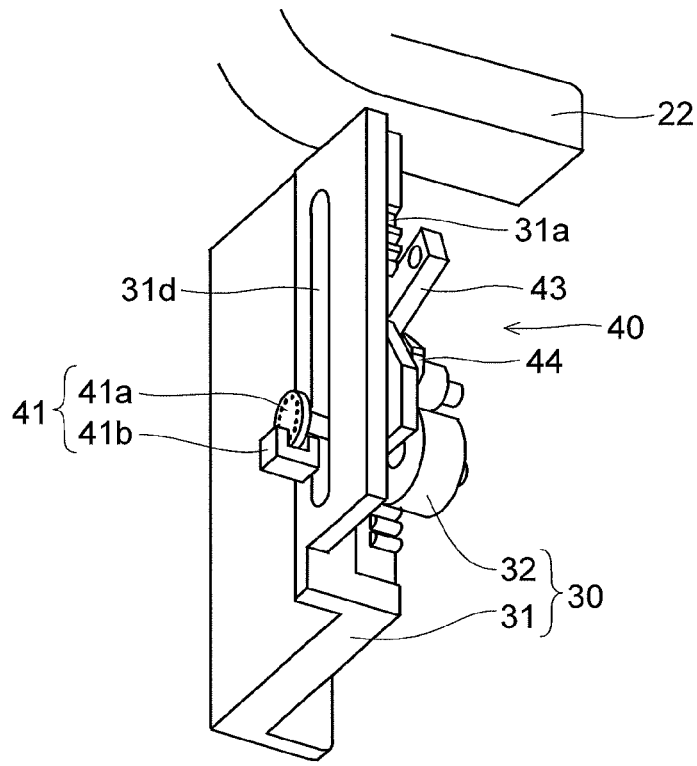
FIG. 8 is a perspective view showing, from a front side, a structure around a movement mechanism and detection mechanism of an image forming apparatus according to an embodiment of the present disclosure.

As shown in FIG. 8, the detection mechanism 41 is composed of: a slit board 41a that is fixed to a shaft portion of the drive gear 32 and rotates unitarily with the drive gear 32; and a sensor 41b. The slit board 41a is provided with slits (holes) at constant angles, and the sensor 41b is provided with a light emitting device and a light receiving device to interpose the slit board 41a. As the slit board 41a rotates, the sensor 41b is turned on and off, and based on an on/off switchover speed of the sensor 41b, rotation speeds of the slit board 41a and drive gear 32 are detected. And, based on the rotation speed of the drive gear 32, the descent speed of the rack member 31 is detected. In the meantime, the rack member 31 is provided with an through hole 31d (see FIG. 8, not shown in FIG. 6, FIG. 9 and the like) which has an elongate shape up and down and into which the shaft portion of the drive gear 32 is inserted.

As shown in FIG. 6, in a case where the descent speed of the rack member 31 is lower than a predetermined value, the solenoid 42 does not extend and is disposed at a predetermined distance away from the stopper 43. On the other hand, as shown in FIG. 9, in a case where the descent speed of the rack member 31 is the predetermined value or higher, the solenoid 42 extends to push the stopper 43 downward.

As shown in FIG. 6, the stopper 43 is composed to swing about a swing shaft 43a. Besides, the stopper 43 is biased in a counterclockwise direction by a bias member (not shown) during a usual period, and does not push the actuator portion 44.

The actuator portion 44 is composed to swing about a swing shaft 44a. Besides, the actuator portion 44 is biased in a counterclockwise direction by a bias member (not shown) during a usual period, and does not engage with the rack gear portion 31a of the rack member 31.

Figure 9:
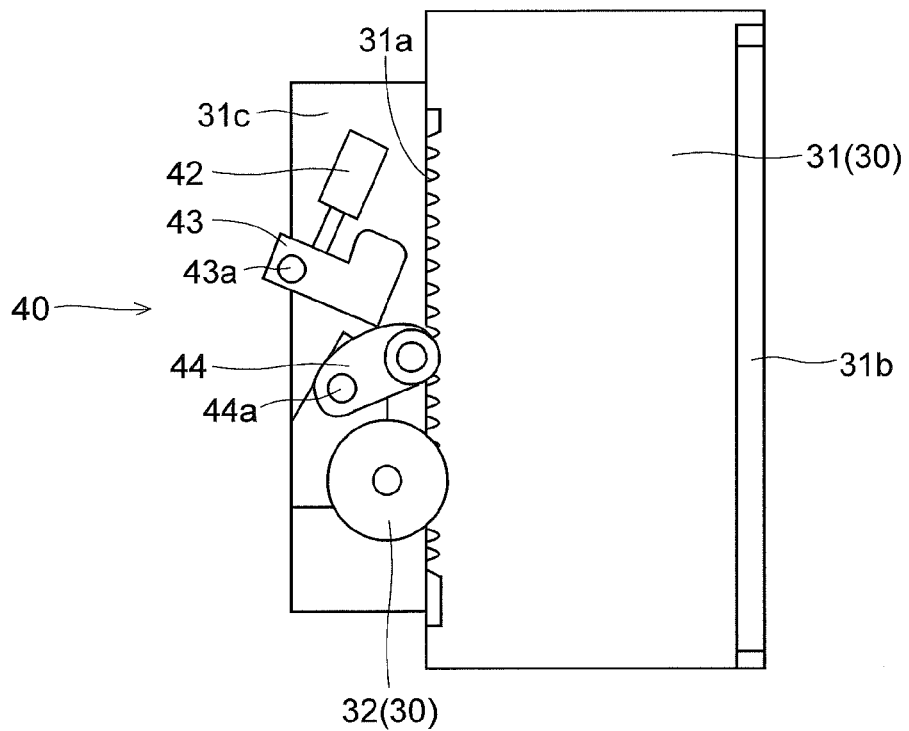
FIG. 9 is a view showing, from a rear side, a structure around a movement mechanism and detection mechanism of an image forming apparatus according to an embodiment of the present disclosure.

In a case where the rack member 31 descends at a speed of the predetermined value or higher, as shown in FIG. 9, the solenoid 42 extends to push the stopper 43 downward, and the stopper 43 swings in a clockwise direction to push the actuator portion 44 downward. In this way, the actuator portion 44 swings in the clockwise direction, and engages with the rack gear portion 31a of the rack member 31 to stop the descent of the rack member 31.

As described above, the present embodiment includes: the swing mechanism 20 that holds the second support member 12 at an arbitrary angle; and the movement mechanism 30 that supports the second support member 12 movably up and down in a translation manner with respect to the first support member 11 and holds the second support member 12 at an arbitrary height. In this way, it is possible to hold the operation panel 3 at an arbitrary angle, besides, move the operation panel 3 up and down in the translation manner with respect to the apparatus main body 1, and hold the operation panel 3 at an arbitrary height. Because of this, it is possible to make the operation panel 3 widely correspond to a height or eyes height of the user; accordingly, it is possible to more improve the visibility and operability for the user.

Besides, as described above, the descent stop mechanism 40 is provided, which stops the descent of the second support member 12 in the case where the second support member 12 descends at the predetermined speed or higher with respect to the first support member 11. In this way, for example, in a case where the user stumbles to touch the operation panel 3, the descent of the operation panel 3 is able to immediately stop to support the user; accordingly, it is possible to improve safety.

Besides, as described above, in the case where the descent speed of the rack member 31 is the predetermined value or higher, the actuator portion 44 engages with the rack member 31 to stop the descent of the rack member 31. In this way, in the case where the descent speed of the second support member 12 is the predetermined value or higher, it is possible to easily stop the descent of the second support member 12.

Besides, as described above, the detection mechanism 41 detects the descent speed of the rack member 31 based on the rotation speed of the drive gear 32. In this way, it is possible to easily detect the descent speed of the rack member 31.

Besides, as described above, the swing mechanism 20 holds the second support member 12 at the predetermined angle in the case where the load exerted onto the operation surface of the operation panel 3 in the direction perpendicular to the operation surface of the operation panel 3 is the first value or lower, and swings the second support member 12 in the case where the load exerted onto the operation surface of the operation panel 3 in the direction perpendicular to the operation surface of the operation panel 3 is larger than the first value. In this way, by exerting a load larger than the first value onto the operation panel 3, it is possible to change the angle of the operation panel 3; accordingly, when changing the angle of the operation panel 3, it is not necessary to unlock the lever member unlike the conventional image forming apparatus. Because of this, it is possible to easily perform the angle adjustment of the operation panel 3.

Besides, as described above, the movement mechanism 30 holds the second support member 12 at the predetermined height in the case where the load exerted onto the operation panel 3 up and down is the second value or lower, and moves the second support member 12 up and down in the case where the load exerted onto the operation panel 3 up and down is larger than the second value. In this way, by exerting a load larger than the second value onto the operation panel 3, it is possible to change the height of the operation panel 3; accordingly, it is possible to easily perform the height adjustment of the operation panel 3.

In the meantime, it should be considered that the embodiment disclosed this time is an example in all respects and is not limiting. The scope of the present disclosure is not indicated by the above description of the embodiment but by the claims, and all modifications within the scope of the claims and the meaning equivalent to the claims are covered.

For example, in the above embodiment, the example is described, in which the operation panel support mechanism 10 is used in the image forming apparatus. However, the present disclosure is not limited to this, and the operation panel support mechanism 10 may be used in an apparatus other than the image forming apparatus.

Besides, in the above embodiment, the example is described, in which the descent stop mechanism 40 is composed of the solenoid 42. However, the present disclosure is not limited to this, and the descent stop mechanism 40 may be composed of, for example, a cam mechanism, another apparatus or the like.

Besides, in the above embodiment, the example is described, in which the detection mechanism 41 is composed of the slit board 41a and the sensor 41b to detect the rotation speed of the drive gear 32. However, the present disclosure is not limited to this. The detection mechanism 41 may be composed of a sensor and the like that directly detect the descent speed of the rack member 31, for example.

Besides, in the above embodiment, the example is described, in which, for example, the wave washer is used to provide the swing mechanism 20 and the movement mechanism 30 with the free stop function. However, the present disclosure is not limited to this. It is possible to use various members that can generate predetermined frictional force (holding force).

What is claimed is:

1. An operation panel support mechanism for mounting an operation panel onto an apparatus main body, comprising:
    a first support member fixed to the apparatus main body,
    a second support member fixed to the operation panel,
    a swing mechanism that supports the second support member swingably up and down and holds the second support member at an arbitrary angle in a swingable range,
    a movement mechanism that supports the second support member movably up and down in a translation manner with respect to the first support member and holds the second support member at an arbitrary height in a translation range, and
    a descent stop mechanism which in a case where the second support member descends at a predetermined speed or higher with respect to the first support member, stops the descent of the second support member, wherein
    the movement mechanism includes: a rack member that moves up and down together with the second support member; and a drive gear that is rotatably supported by the first support member and engages with the rack member,
    the descent stop mechanism includes: a detection mechanism that detects a descent speed of the rack member; and an actuator portion that is driven based on a detection result from the detection mechanism, wherein
    in a case where the descent speed of the rack member is a predetermined value or higher, the actuator portion engages with the rack member to stop the descent of the rack member.

2. The operation panel support mechanism according to claim 1, wherein
    based on a rotation speed of the drive gear, the detection mechanism detects the descent speed of the rack member.

3. The operation panel support mechanism according to claim 1, wherein
    the swing mechanism holds the second support member at a predetermined angle in a case where a load exerted onto an operation surface of the operation panel in a direction perpendicular to the operation surface of the operation panel is a first value or lower, and swings the second support member in a case where the load exerted onto the operation surface of the operation panel in the direction perpendicular to the operation surface of the operation panel is larger than the first value.

4. The operation panel support mechanism according to claim 1, wherein
    the movement mechanism holds the second support member at a predetermined height in a case where a load exerted onto the operation panel up and down is a second value or lower, and moves the second support member up and down in a case where the load exerted onto the operation panel up and down is larger than the second value.

5. An image forming apparatus comprising:
    the operation panel support mechanism according to claim 1, and
    the operation panel supported by the operation panel support mechanism.

* * * * *